United States Patent
Hung et al.

(10) Patent No.: US 11,132,176 B2
(45) Date of Patent: Sep. 28, 2021

(54) NON-VOLATILE COMPUTING METHOD IN FLASH MEMORY

(71) Applicant: MACRONIX INTERNATIONAL CO., LTD., Hsinchu (TW)

(72) Inventors: Chun-Hsiung Hung, Hsinchu (TW); Shang-Chi Yang, Changhua (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 149 days.

(21) Appl. No.: 16/359,919

(22) Filed: Mar. 20, 2019

(65) Prior Publication Data

US 2020/0301667 A1    Sep. 24, 2020

(51) Int. Cl.
*G06F 7/544*    (2006.01)
*G11C 16/24*    (2006.01)
(Continued)

(52) U.S. Cl.
CPC ........ *G06F 7/5443* (2013.01); *G11C 11/5642* (2013.01); *G11C 11/5671* (2013.01);
(Continued)

(58) Field of Classification Search
CPC ........ G06F 7/5443; G06F 17/16; G06G 7/16; G11C 11/00–5692; G11C 16/00–3495
See application file for complete search history.

(56) References Cited

U.S. PATENT DOCUMENTS 4,219,829 A    8/1980    Dorda et al.
4,987,090 A    1/1991    Hsu et al.
(Continued)

FOREIGN PATENT DOCUMENTS

CN    1998012 B    11/2010
CN    105718994 A    6/2016
(Continued)

OTHER PUBLICATIONS

F. Merrikh-Bayat et al. "High-Performance Mixed-Signal Neurocomputing With Nanoscale Floating-Gate Memory Cell Arrays," in IEEE Transactions on Neural Networks and Learning Systems, vol. 29, No. 10, pp. 4782-4790, Oct. 2018, doi: 10.1109/TNNLS.2017.27789 (Year: 2018).*
(Continued)

*Primary Examiner* — Aimee Li
*Assistant Examiner* — Carlo Waje
(74) *Attorney, Agent, or Firm* — Haynes Beffel & Wolfeld LLP

(57) ABSTRACT

An in-memory multiply and accumulate circuit includes a memory array, such as a NOR flash array, storing weight values $W_{i,n}$. A row decoder is coupled to the set of word lines, and configured to apply word line voltages to select word lines in the set. Bit line bias circuits produce bit line bias voltages for the respective bit lines as a function of input values $X_{i,n}$ on the corresponding inputs. Current sensing circuits are connected to receive currents in parallel from a corresponding multimember subset of bit lines in the set of bit lines, and to produce an output in response to a sum of currents.

20 Claims, 8 Drawing Sheets

(51) Int. Cl.
*G11C 16/08* (2006.01)
*G11C 11/56* (2006.01)
*G11C 16/04* (2006.01)

(52) U.S. Cl.
CPC .......... *G11C 16/0483* (2013.01); *G11C 16/08* (2013.01); *G11C 16/24* (2013.01); *G11C 2211/5631* (2013.01)

(56) References Cited

U.S. PATENT DOCUMENTS

| | | | |
|---|---|---|---|
| 5,029,130 A * | 7/1991 | Yeh | G11C 16/0425 365/185.31 |
| 5,586,073 A | 12/1996 | Hiura et al. | |
| 6,107,882 A | 8/2000 | Gabara et al. | |
| 6,313,486 B1 | 11/2001 | Kencke et al. | |
| 6,829,598 B2 | 12/2004 | Milev | |
| 6,906,940 B1 | 6/2005 | Lue | |
| 6,960,499 B2 | 11/2005 | Nandakumar et al. | |
| 7,089,218 B1 | 8/2006 | Visel | |
| 7,368,358 B2 | 5/2008 | Ouyang et al. | |
| 7,436,723 B2 | 10/2008 | Rinerson et al. | |
| 7,747,668 B2 | 6/2010 | Nomura et al. | |
| 8,203,187 B2 | 6/2012 | Lung et al. | |
| 8,275,728 B2 | 9/2012 | Pino | |
| 8,432,719 B2 | 4/2013 | Lue | |
| 8,589,320 B2 | 11/2013 | Breitwisch et al. | |
| 8,630,114 B2 * | 1/2014 | Lue | H01L 27/0688 365/185.05 |
| 8,725,670 B2 | 5/2014 | Visel | |
| 8,860,124 B2 | 10/2014 | Lue et al. | |
| 9,064,903 B2 | 6/2015 | Mitchell et al. | |
| 9,147,468 B1 | 9/2015 | Lue | |
| 9,213,936 B2 | 12/2015 | Visel | |
| 9,379,129 B1 | 6/2016 | Lue et al. | |
| 9,391,084 B2 | 7/2016 | Lue | |
| 9,430,735 B1 * | 8/2016 | Vali | G11C 16/08 |
| 9,431,099 B2 | 8/2016 | Lee et al. | |
| 9,524,980 B2 | 12/2016 | Lue | |
| 9,535,831 B2 | 1/2017 | Jayasena et al. | |
| 9,536,969 B2 | 1/2017 | Yang et al. | |
| 9,589,982 B1 | 3/2017 | Cheng et al. | |
| 9,698,156 B2 | 7/2017 | Lue | |
| 9,698,185 B2 | 7/2017 | Chen et al. | |
| 9,710,747 B2 | 7/2017 | Kang et al. | |
| 9,747,230 B2 | 8/2017 | Han et al. | |
| 9,754,953 B2 | 9/2017 | Tang et al. | |
| 9,767,028 B2 | 9/2017 | Cheng et al. | |
| 9,898,207 B2 | 2/2018 | Kim et al. | |
| 9,910,605 B2 | 3/2018 | Jayasena et al. | |
| 9,978,454 B2 | 5/2018 | Jung | |
| 9,983,829 B2 | 5/2018 | Ravimohan et al. | |
| 9,991,007 B2 * | 6/2018 | Lee | G11C 8/10 |
| 10,037,167 B2 | 7/2018 | Kwon et al. | |
| 10,056,149 B2 | 8/2018 | Yamada et al. | |
| 10,073,733 B1 | 9/2018 | Jain et al. | |
| 10,157,012 B2 | 12/2018 | Kelner et al. | |
| 10,175,667 B2 | 1/2019 | Bang et al. | |
| 10,242,737 B1 | 3/2019 | Lin et al. | |
| 10,311,921 B1 * | 6/2019 | Parkinson | G11C 7/06 |
| 10,528,643 B1 * | 1/2020 | Choi | G06F 17/16 |
| 10,534,840 B1 * | 1/2020 | Petti | G06N 3/04 |
| 10,635,398 B2 | 4/2020 | Lin et al. | |
| 10,643,713 B1 * | 5/2020 | Louie | G11C 7/06 |
| 10,719,296 B2 | 7/2020 | Lee et al. | |
| 10,777,566 B2 | 9/2020 | Lue | |
| 10,783,963 B1 | 9/2020 | Hung et al. | |
| 10,825,510 B2 * | 11/2020 | Jaiswal | G11C 7/1006 |
| 10,860,682 B2 * | 12/2020 | Knag | G06F 17/16 |
| 10,957,392 B2 | 3/2021 | Lee et al. | |
| 2003/0122181 A1 | 7/2003 | Wu | |
| 2005/0287793 A1 | 12/2005 | Blanchet et al. | |
| 2010/0182828 A1 | 7/2010 | Shima et al. | |
| 2010/0202208 A1 | 8/2010 | Endo et al. | |
| 2011/0063915 A1 | 3/2011 | Tanaka et al. | |
| 2011/0106742 A1 | 5/2011 | Pino | |
| 2011/0128791 A1 * | 6/2011 | Chang | G11C 16/3477 365/185.22 |
| 2011/0286258 A1 | 11/2011 | Chen et al. | |
| 2011/0297912 A1 | 12/2011 | Samachisa et al. | |
| 2012/0007167 A1 * | 1/2012 | Hung | H01L 27/0688 257/324 |
| 2012/0044742 A1 | 2/2012 | Narayanan | |
| 2012/0182801 A1 * | 7/2012 | Lue | G11C 11/4097 365/185.05 |
| 2012/0235111 A1 | 9/2012 | Osano et al. | |
| 2012/0254087 A1 | 10/2012 | Visel | |
| 2013/0070528 A1 | 3/2013 | Maeda | |
| 2013/0075684 A1 | 3/2013 | Kinoshita et al. | |
| 2014/0063949 A1 | 3/2014 | Tokiwa | |
| 2014/0119127 A1 * | 5/2014 | Lung | G11C 16/0475 365/185.21 |
| 2014/0149773 A1 | 5/2014 | Huang et al. | |
| 2014/0268996 A1 | 9/2014 | Park | |
| 2014/0330762 A1 | 11/2014 | Visel | |
| 2015/0008500 A1 | 1/2015 | Fukumoto et al. | |
| 2015/0171106 A1 | 6/2015 | Suh | |
| 2015/0199126 A1 | 7/2015 | Jayasena et al. | |
| 2015/0331817 A1 | 11/2015 | Han et al. | |
| 2016/0141337 A1 | 5/2016 | Shimabukuro et al. | |
| 2016/0181315 A1 | 6/2016 | Lee et al. | |
| 2016/0232973 A1 | 8/2016 | Jung | |
| 2016/0247579 A1 * | 8/2016 | Ueda | G11C 13/0002 |
| 2016/0308114 A1 | 10/2016 | Kim et al. | |
| 2016/0336064 A1 | 11/2016 | Seo et al. | |
| 2016/0358661 A1 | 12/2016 | Vali et al. | |
| 2017/0003889 A1 | 1/2017 | Kim et al. | |
| 2017/0025421 A1 | 1/2017 | Sakakibara et al. | |
| 2017/0092370 A1 | 3/2017 | Harari | |
| 2017/0123987 A1 | 5/2017 | Cheng et al. | |
| 2017/0148517 A1 | 5/2017 | Harari | |
| 2017/0160955 A1 | 6/2017 | Jayasena et al. | |
| 2017/0169885 A1 | 6/2017 | Tang et al. | |
| 2017/0169887 A1 | 6/2017 | Widjaja | |
| 2017/0263623 A1 | 9/2017 | Zhang et al. | |
| 2017/0270405 A1 | 9/2017 | Kurokawa | |
| 2017/0309634 A1 | 10/2017 | Noguchi et al. | |
| 2017/0316833 A1 | 11/2017 | Ihm et al. | |
| 2017/0317096 A1 | 11/2017 | Shin et al. | |
| 2017/0337466 A1 | 11/2017 | Bayat et al. | |
| 2018/0121790 A1 | 5/2018 | Kim et al. | |
| 2018/0129424 A1 | 5/2018 | Confalonieri et al. | |
| 2018/0144240 A1 | 5/2018 | Garbin et al. | |
| 2018/0157488 A1 | 6/2018 | Shu et al. | |
| 2018/0173420 A1 | 6/2018 | Li et al. | |
| 2018/0176497 A1 * | 6/2018 | Saha | H04N 5/18 |
| 2018/0189640 A1 | 7/2018 | Henry et al. | |
| 2018/0240522 A1 | 8/2018 | Jung | |
| 2018/0246783 A1 | 8/2018 | Avraham et al. | |
| 2018/0286874 A1 | 10/2018 | Kim et al. | |
| 2018/0342299 A1 | 11/2018 | Yamada et al. | |
| 2018/0350823 A1 | 12/2018 | Or-Bach et al. | |
| 2019/0019564 A1 * | 1/2019 | Li | H01L 29/7923 |
| 2019/0035449 A1 * | 1/2019 | Saida | G11C 11/161 |
| 2019/0043560 A1 | 2/2019 | Sumbul et al. | |
| 2019/0058448 A1 * | 2/2019 | Seebacher | H04B 1/401 |
| 2019/0065151 A1 | 2/2019 | Chen et al. | |
| 2019/0102170 A1 * | 4/2019 | Chen | G11C 13/004 |
| 2019/0148393 A1 | 5/2019 | Lue | |
| 2019/0164044 A1 | 5/2019 | Song et al. | |
| 2019/0213234 A1 * | 7/2019 | Bayat | G11C 11/54 |
| 2019/0220249 A1 | 7/2019 | Lee et al. | |
| 2019/0244662 A1 | 8/2019 | Lee et al. | |
| 2019/0286419 A1 | 9/2019 | Lin et al. | |
| 2019/0311749 A1 | 10/2019 | Song et al. | |
| 2019/0325959 A1 | 10/2019 | Bhargava et al. | |
| 2019/0363131 A1 | 11/2019 | Torng et al. | |
| 2020/0026993 A1 | 1/2020 | Otsuka | |
| 2020/0065650 A1 * | 2/2020 | Tran | G06N 3/0454 |
| 2020/0110990 A1 * | 4/2020 | Harada | H01L 27/108 |

(56) References Cited

U.S. PATENT DOCUMENTS

| | | | | |
|---|---|---|---|---|
| 2020/0160165 | A1* | 5/2020 | Sarin | G06N 3/049 |
| 2020/0334015 | A1* | 10/2020 | Shibata | G06F 7/50 |

FOREIGN PATENT DOCUMENTS

| | | | |
|---|---|---|---|
| CN | 105789139 | A | 7/2016 |
| CN | 106530210 | A | 3/2017 |
| EP | 2048709 | A2 | 4/2009 |
| TW | 201523838 | A | 6/2015 |
| TW | 201618284 | A | 5/2016 |
| TW | 201639206 | A | 11/2016 |
| TW | 201732824 | A | 9/2017 |
| TW | 201741943 | A | 12/2017 |
| TW | 201802800 | A | 1/2018 |
| TW | 201822203 | A | 6/2018 |
| WO | 2012009179 | A1 | 1/2012 |
| WO | 2012015450 | A1 | 2/2012 |
| WO | 2016060617 | A1 | 4/2016 |
| WO | 2017091338 | A1 | 6/2017 |
| WO | 2018201060 | A1 | 11/2018 |

OTHER PUBLICATIONS

X. Guo et al., "Fast, energy-efficient, robust, and reproducible mixed-signal neuromorphic classifier based on embedded NOR flash memory technology," 2017 IEEE International Electron Devices Meeting (IEDM), San Francisco, CA, 2017, pp. 6.5.1-6.5.4, doi: 10.1109/IEDM.2017.8268341. (Year: 2017).*

S. Aritome, R. Shirota, G. Hemink, T. Endoh and F. Masuoka, "Reliability issues of flash memory cells," in Proceedings of the IEEE, vol. 81, No. 5, pp. 776-788, May 1993, doi: 10.1109/5.220908. (Year: 1993).*

U.S. Office Action in U.S. Appl. No. 16/233,414 dated Apr. 20, 2020, 17 pages.

Chen et al., "Eyeriss: An Energy-Efficient reconfigurable accelerator for deep convolutional neural networks," IEEE ISSCC, Jan. 31-Feb. 4, 2016, 3 pages.

EP Extended Search Report from EP19193290.4 dated Feb. 14, 2020, 10 pages.

Gonugondla et al., "Energy-Efficient Deep In-memory Architecture for NAND Flash Memories," IEEE International Symposium on Circuits and Systems (ISCAS), May 27-30, 2018, 5 pages.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

TW Office Action from TW Application No. 10820980430, dated Oct. 16, 2019, 6 pages (with English Translation).

U.S. Office Action in U.S. Appl No. 15/873,369 dated Dec. 4, 2019, 5 pages.

U.S. Office Action in U.S. Appl No. 15/887,166 dated Jul. 10, 2019, 18 pages.

U.S. Office Action in U.S. Appl No. 15/922,359 dated Oct. 11, 2019, 7 pages.

U.S. Office Action in U.S. Appl. No. 16/233,414 dated Oct. 31, 2019, 22 pages.

U.S. Office Action in related case U.S. Appl. No. 16/037,281 dated Dec. 19, 2019, 9 pages.

U.S. Office Action in related case U.S. Appl. No. 16/297,504 dated Feb. 4, 2020, 15 pages.

Wang et al., "Three-Dimensional NAND Flash for Vector-Matrix Multiplication," IEEE Trans. on Very Large Scale Integration Systems (VLSI), vol. 27, No. 4, Apr. 2019, 4 pages.

Anonymous, "Data in the Computer", May 11, 2015, pp. 1-8, https://web.archive.org/web/20150511143158/https:// homepage.cs.uri.edu/faculty/wolfe/book/Readings/Reading02.htm (Year: 2015)—

See Office Action dated Aug. 17, 2020 in U.S. Appl. No. 16/279,494 for relevance—no year provided by examiner.

Rod Nussbaumer, "How is data transmitted through wires in the computer?", Aug. 27, 2015, pp. 1-3, https://www.quora.com/ How-is-data-transmitted-through-wires-in-the-computer (Year: 2015)— See Office Action dated Aug. 17, 2020 in U.S. Appl. No. 16/279,494 for relevance—no year provided by examiner.

Scott Thornton, "What is DRAm (Dynamic Random Access Memory) vs SRAM?", Jun. 22, 2017, pp. 1-11, https://www.microcontrollertips.com/dram-vs-sram/ (Year: 2017)—See Office Action dated Aug. 17, 2020 in U.S. Appl. No. 16/279,494 for relevance—no year provided by examiner.

TW Office Action from TW Application No. 10920683760, dated Jul. 20, 2020, 4 pages.

U.S. Office Action in U.S. Appl. No. 16/233,404 dated Jul. 30, 2020, 20 pages.

U.S. Office Action in U.S. Appl. No. 16/279,494 dated Aug. 17, 2020, 25 pages.

Webopedia, "DRAM—dynamic random access memory", Jan. 21, 2017, pp. 1-3, https://web.archive.org/web/20170121124008/https:// www.webopedia.com/TERM/D/DRAM.html (Year: 2017)—See Office Action dated Aug. 17, 2020 in U.S. Appl. No. 16/279,494 for relevance—no year provided by examiner.

Webopedia, "volatile memory", Oct. 9, 2017, pp. 1-4, https://web.archive.org/web/20171009201852/https://www.webopedia.com/ TERMN/volatile_memory.html (Year: 2017)—See Office Action dated Aug. 17, 2020 in U.S. Appl. No. 16/279,494 for relevance— no year provided by examiner.

U.S. Office Action in related case U.S. Appl. No. 15/873,369 dated May 9, 2019, 8 pages.

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

U.S. Office Action in U.S. Appl. No. 15/922,359 dated Jun. 24, 2019, 8 pages.

EP Extended Search Report from 18155279.5—1203 dated Aug. 30, 2018, 8 pages.

EP Extended Search Report from EP18158099.4 dated Sep. 19, 2018, 8 pages.

Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.

Kim et al. "Multi-Layered Vertical Gate NAND Flash Overcoming Stacking Limit for Terabit Density Storage," 2009 Symposium on VLSI Technology Digest of Papers, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187. (cited in parent—copy not provided herewith).

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., "Neuromorphic Computing: From Materials to Systems Architecture," US Dept. of Energy, Oct. 29-30, 2015, Gaithersburg, MD, 40 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka H., et al., "Bit Cost Scalable Technology with Punch and Plug Process for Ultra High Density Flash Memory," 2007 Symp. VLSI Tech., Digest of Tech. Papers, pp. 14-15.

(56) References Cited

OTHER PUBLICATIONS

U.S. Office Action in U.S. Appl. No. 15/887,166 dated Jan. 30, 2019, 18 pages.
U.S. Appl. No. 15/873,369, filed Jan. 17, 2018, entitled "Sum-of-Products Accelerator Array," Lee et al., 52 pages.
U.S. Appl. No. 15/887,166 filed Feb. 2, 2018, entitled "Sum-of-Products Array for Neuromorphic Computing System," Lee et al., 49 pages.
U.S. Appl. No. 15/895,369 filed Feb. 13, 2018, entitled "Device Structure for Neuromorphic Computing System," Lin et al., 34 pages.
U.S. Appl. No. 15/922,359 filed Mar. 15, 2018, entitled "Voltage Sensing Type of Matrix Multiplication Method for Neuromorphic Computing System," Lin et al., 40 pages.
U.S. Appl. No. 16/037,281 filed Jul. 17, 2018, 87 pages.
Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.
Chen et al., "A Highly Pitch Scalable 3D Vertical Gate (VG) NAND Flash Decoded by a Novel Self-Aligned Independently Controlled Double Gate (IDG) StringSelect Transistor (SSL)," 2012 Symp. on VLSI Technology (VLSIT), Jun. 12-14, 2012, pp. 91-92.
Choi et al., "Performance Breakthrough in NOR Flash Memory With Dopant-Segregated Schottky-Barrier (DSSB) SONOS Devices," Jun. 2009 Symposium on VLSITechnology Digest of Technical Papers, pp. 222-223.
Fukuzumi et al. "Optimal Integration and Characteristics of Vertical Array Devices for Ultra-High Density, Bit-Cost Scalable Flash Memory," IEEE Dec. 2007, pp. 449-452.
Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.
Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.
Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.
Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137. cited byapplicant.
Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.
Kim et al., "Three-Dimensional NAND Flash Architecture Design Based on Single-Crystalline STacked ARray," IEEE Transactions on Electron Devices, vol. 59, No. 1, pp. 35-45, Jan. 2012.
Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.
Nowak et al., "Intrinsic fluctuations in Vertical NAND flash memories," 2012 Symposium on VLSI Technology, Digest of Technical Papers, pp. 21-22, Jun. 12-14, 2012.
TW Office Action from TW Application No. 10820907820, dated Sep. 22, 2020, 41 pages.
Wang, Michael, "Technology Trends on 3D-NAND Flash Storage", Impact 2011, Taipei, dated Oct. 20, 2011, found at www.impact.org.tw/2011/Files/NewsFile/201111110190.pdf.
Y.X. Liu et al., "Comparative Study of Tri-Gate and Double-Gate-Type Poly-Si Fin-Channel Spli-Gate Flash Memories," 2012 IEEE Silicon Nanoelectronics Workshop (SNW), Honolulu, HI, Jun. 10-11, 2012, pp. 1-2.
U.S. Office Action in U.S. Appl. No. 16/224,602 dated Mar. 24, 2021, 17 pages.
U.S. Office Action in U.S. Appl. No. 16/279,494 dated Nov. 12, 2020, 25 pages.
Webopedia, "SoC", Oct. 5, 2011, pp. 1-2, https://web.archive.org/web/20111005173630/https://www.webopedia.com/ TERM/S/SoC.html (Year: 2011)—See Office Action dated Aug. 17, 2020 in U.S. Appl. No. 16/279,494 for relevance—no month provided by examiner.
U.S. Office Action in U.S. Appl. No. 16/224,602 dated Nov. 23, 2020, 14 pages.

* cited by examiner

| Input | | | | | Output | | |
|---|---|---|---|---|---|---|---|
| sense0 | sense1 | sense2 | Bit1 | Bit2 | EN2 | EN1 | EN0 |
| 1 | X | X | X | X | 1 | 0 | 0 |
| X | 1 | X | 1 | X | 1 | 1 | 0 |
| X | 1 | X | 0 | X | 0 | 1 | 0 |
| X | X | 1 | 1 | 1 | 1 | 1 | 1 |
| X | X | 1 | 1 | 0 | 1 | 0 | 1 |
| X | X | 1 | 0 | 1 | 0 | 1 | 1 |
| X | X | 1 | 0 | 0 | 0 | 0 | 1 |
| 0 | 0 | 0 | X | X | 0 | 0 | 0 |

NON-VOLATILE COMPUTING METHOD IN FLASH MEMORY

BACKGROUND

Field

The present invention relates to circuitry that can be used to perform in-memory computation, such as multiply and accumulate or other sum-of-products like operations.

Description of Related Art

In neuromorphic computing systems, machine learning systems and circuitry used for some types of computations based on linear algebra, the multiply and accumulate or sum-of-products functions can be an important component. Such functions can be expressed as follows:

$$f(X_i) = \sum_{i=1}^{M} W_i X_i$$

In this expression, each product term is a product of a variable input $X_i$ and a weight $W_i$. The weight $W_i$ can vary among the terms, corresponding for example to coefficients of the variable inputs $X_i$.

The sum-of-products function can be realized as a circuit operation using cross-point array architectures in which the electrical characteristics of cells of the array effectuate the function. One problem associated with large computations of this type arises because of the complexity of the data flow among memory locations used in the computations which can involve large tensors of input variables and large numbers of weights.

It is desirable to provide structures for sum-of-products operations suitable for implementation in-memory, to reduce the number of data movement operations required.

SUMMARY

A technology for in-memory multiply and accumulate functions is described. In one aspect, the technology provides a method using an array of memory cells, such as NOR flash architecture memory cells.

One method described includes programming M memory cells in a row of the array on a particular word line WLn, and on a plurality of bit lines BLi, for i going from 0 to M−1, with values $W_{i,n}$, for i going from 0 to M−1, or accessing already programmed memory cells by for example controlling a row decoder to select a word line for a particular row of programmed cells. The values $W_{i,n}$ can correspond with weights, or coefficients, of the terms in a sum-of-products or multiply and accumulate function that uses the cells on word line WLn, and bit line BLi. The values $W_{i,n}$ can be based on multiple bits per cell. In NOR flash memory embodiments, the values $W_{i,n}$ correspond with threshold values of the memory cells. Also, this method includes biasing the bit lines BLi, with input values $X_{i,n}$, respectively, for i going from 0 to M−1 for the cells on the word line WLn. The input values can be analog bias voltages that are generated using a digital-to-analog converter in response to multibit digital input signals for each term of the sum-of-products function. This method includes applying a word line voltage to the particular word line WLn so that the memory cells on the row conduct current corresponding to a product $W_{i,n} * X_{i,n}$ from respective cells in the row. The currents conducted by the cells in the row represent respective terms of a sum-of-products function, and are summed to produce an output current representing a sum of the terms. The output current is sensed to provide the result of the in-memory computation of the sum-of-products function.

In some embodiments, the row of memory cells in an array can be configured into P sets of M cells each, and M is greater than 1. The output current from each of the P sets of M cells can be summed in parallel.

In some embodiments, multiple rows of the array can be programmed or accessed, and results computed for each row in sequence according to control circuitry and commands applied to configure the operation. Also, in some embodiments, multiple rows of the array can be programmed or accessed in a single sensing operation, and results computed for each bit line according to control circuitry and commands applied to configure the operation.

Also, an in-memory multiply and accumulate circuit is described. In an example described herein, the circuit includes a memory array including memory cells on a set of word lines and a set of bit lines, such as a NOR flash array, storing respective weight values $W_{i,n}$. A row decoder is coupled to the set of word lines, and configured to apply word line voltages to select word lines in the set. A plurality of bit line bias circuits is included. Bit line bias circuits have corresponding inputs connected to an input data path, and have outputs connected to respective bit lines in the set of bit lines. The bit line bias circuits produce bit line bias voltages for the respective bit lines as a function of input values $X_{i,n}$ on the corresponding inputs. A circuit includes a plurality of current sensing circuits, each of the plurality of current sensing circuits is connected to receive currents in parallel from a corresponding multimember subset of bit lines in the set of bit lines, and to produce an output in response to a sum of currents from the corresponding multi-member subset of bit lines. In some embodiments, the multimember subset of bit lines can be the entire set of bit lines. In other embodiments, the circuit can include a plurality of multimember subsets usable in parallel.

In other embodiments, a row decoder is coupled to the set of word lines, and configured to apply word line voltages to select a plurality of word lines in the set to access a plurality of memory cells in parallel. A plurality of bit line bias circuits is included. Bit line bias circuits have corresponding inputs connected to an input data path, and have outputs connected to respective bit lines in the set of bit lines. The bit line bias circuits produce bit line bias voltages for the respective bit lines as a function of input values $X_{i,n}$ on the corresponding inputs. A circuit includes a plurality of current sensing circuits, each of the plurality of current sensing circuits is connected directly or via a switch, to receive current from a selected one of the bit lines, and to produce an output in response to a sum of currents from the corresponding plurality of memory cells on the selected bit line.

In some embodiments, the bit line bias circuits can comprise digital-to-analog DAC converters.

Also, in one circuit described herein, some or all of the memory cells in the array are connected between corresponding bit lines and a common reference line, which can be referred to in connection with a NOR flash array as a common source line. A source line bias circuit can be connected to the common source line, and to the bit line bias circuits to compensate for variations in the voltage on the common source line.

DETAILED DESCRIPTION

A detailed description of embodiments of the present invention is provided with reference to the FIGS. 1-10.

Figure 1:
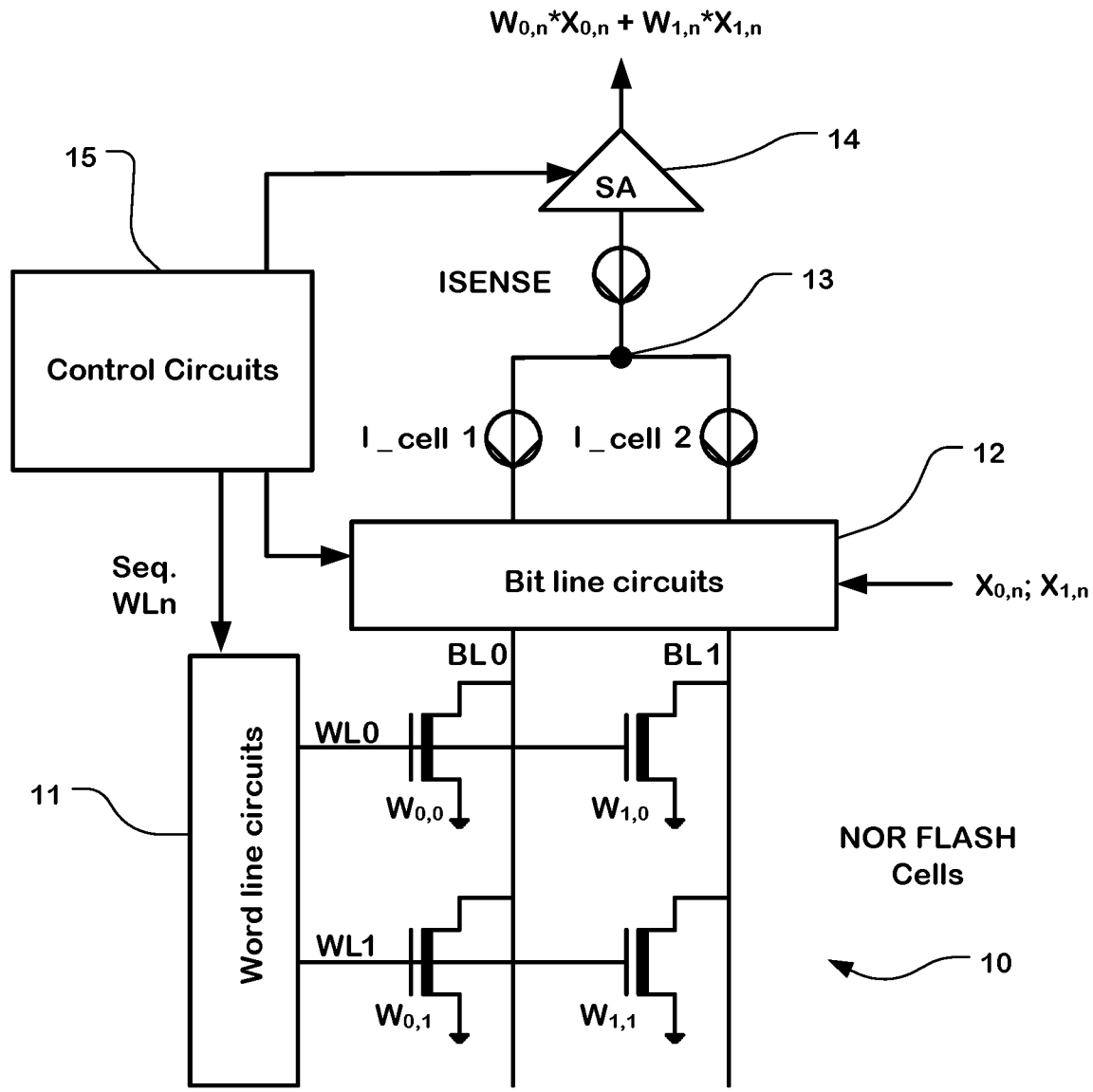
FIG. 1 is a simplified diagram of an in-memory sum-of-products circuit according to embodiments described herein.

FIG. 1 illustrates an in-memory sum-of-products circuit. The circuit includes an array 10 of NOR flash cells. The array 10 includes a plurality of bit lines BL0 and BL1 and a plurality of word lines WL0 and WL1.

Memory cells in the array are disposed on the plurality of bit lines and the plurality of word lines. Each memory cell stores a weight $W_{0,0}$; $W_{1,0}$; $W_{0,1}$; $W_{1,1}$; which acts as a coefficient of a term of the sum-of-products function.

Word line circuits 11, which can include word line decoders and drivers are configured to apply word line voltages on selected word lines in support of the sum-of-products function.

Bit line circuits 12 include circuitry to bias each bit line in the plurality of bit lines with a bias voltage that corresponds to an input value for each term of the sum-of-products function, where inputs $X_{0,n}$ and $X_{1,n}$ correspond with the input value for bit line BL0 and bit line BL1 stored in cells on a particular word line WLn.

The outputs from the bit line circuits for bit lines BL0 and BL1 represented in FIG. 1 as I-cell 1 and I_cell 2 are coupled to a summing node 13 to produce an output current ISENSE for the plurality of cells. The output current ISENSE is connected to a sense amplifier 14 which outputs a value corresponding to the sum of the terms $W_{0,n}*X_{0,n} + W_{1,n}*X_{1,n}$.

Control circuits 15 are configured to execute operations to program the weights in the cells in the array, and to execute the sum-of-products operations. The programming can be implemented using state machines and logic circuits adapted for programming the particular type of memory cell in the array. In embodiments described herein, multibit programming, or multilevel programming, is utilized to store weights that can have 2-bit, 3-bit, 4-bit or more bit values or effectively an analog value. In support of programming, circuitry such as a page buffer, program voltage generators, and program pulse and verify sequence logic can be included.

The control circuits 15 in support of executing sum-of-products operations, can include a sequencer or decoder that selects word lines corresponding to the rows of weights to be used in a particular cycle of calculation. In one example, a sequence of computations can be executed by applying word line voltages to the word lines in the array in sequence to access corresponding rows of cells, while input values corresponding to each row are applied in parallel for each sequence on the bit line circuits. The sum of products computation can comprise a sum of currents in one or more selected memory cells on a plurality of bit lines, or in other embodiments, a sum of currents in a plurality of memory cells on one bit line.

The control circuits 15 can also include logic for controlling the timing and functioning of the sense amplifier 14, for generating multibit outputs in response to the output current ISENSE.

In the example illustrated by FIG. 1, the memory cells in the array can include charge storage memory cells, such as floating gate cells or dielectric charge trapping cells, having drain terminals coupled to corresponding bit lines, and source terminals coupled to ground. Other types of memory cells can be utilized in other embodiments, including but not limited to many types of programmable resistance memory cells like phase change based memory cells, magnetoresistance based memory cells, metal oxide based memory cells, and others.

Figure 2:
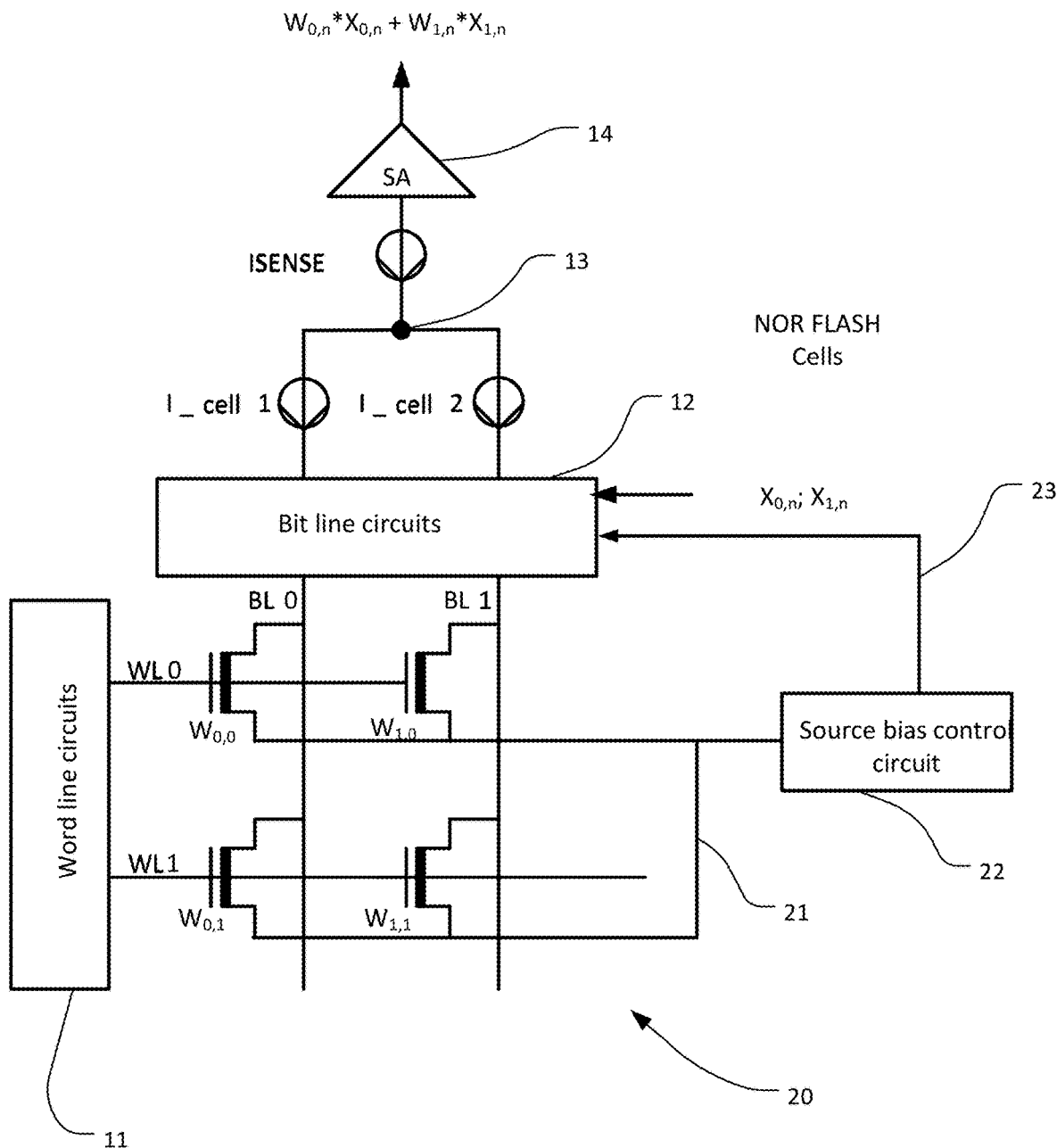
FIG. 2 is a simplified diagram of an alternative implementation of an in-memory sum-of-products circuit according to embodiments described herein.

FIG. 2 illustrates an alternative embodiment, in which components corresponding to components of FIG. 1 have like reference numerals and are not described again. In the embodiment of FIG. 2, the memory cells in the array 20 are coupled between corresponding bit lines and a common source line 21. The common source line 21 is coupled to a source bias control circuit 22, which is also connected to the bit line circuits 12. The source bias control circuit 22 provides a feedback signal on line 23 to the bit line circuits based on variations in the voltage on the common source line 21. The bit line circuits 12 can adjust the level of bias voltages applied to the bit lines by the bit line circuits 12 in response to the feedback signal on line 23. This can be used to compensate for a source crowding effect. If the source voltage on the common source line increases, a corresponding increase in the bit line bias voltages can be induced.

Figure 3:
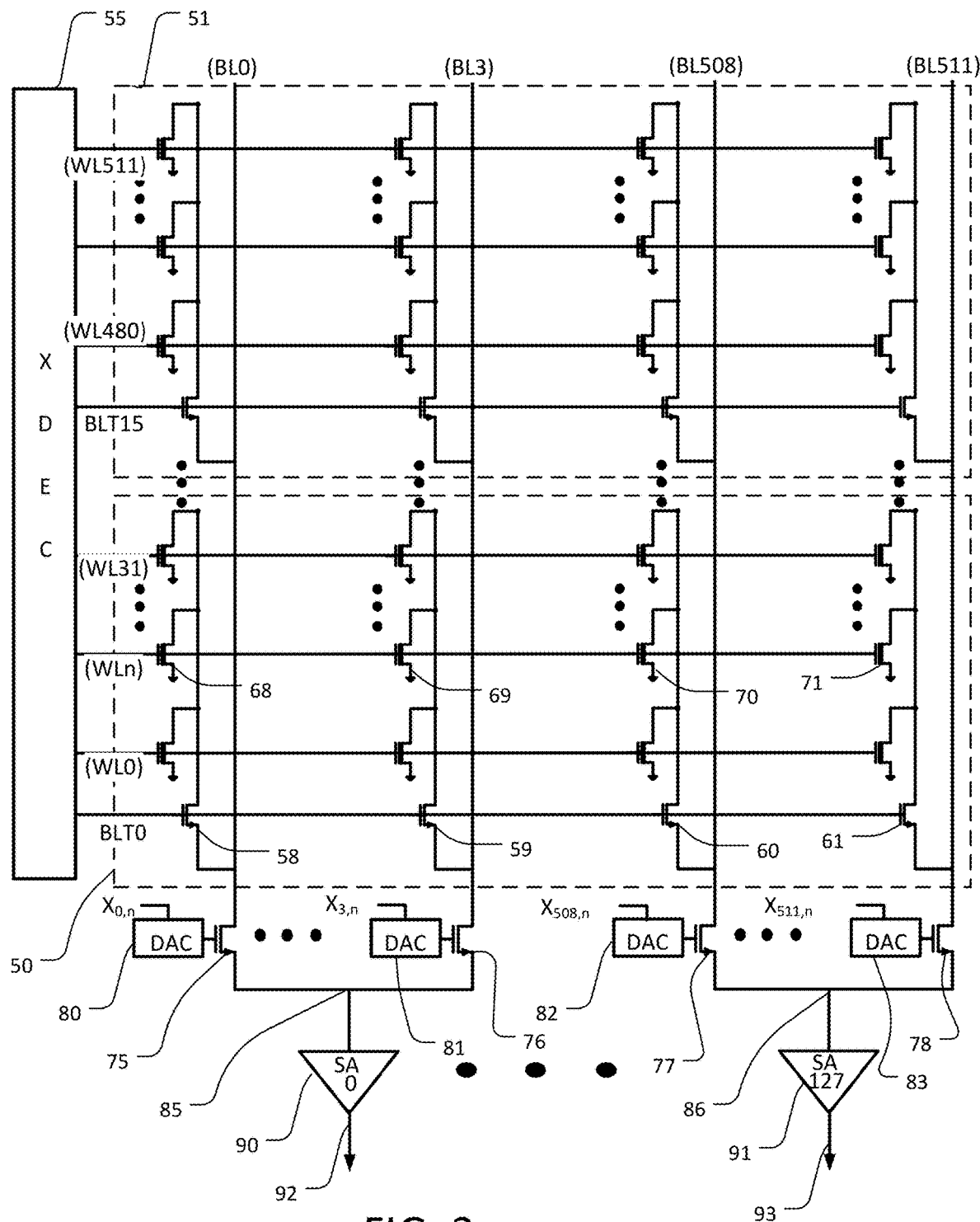
FIG. 3 is a more detailed diagram of a sum-of-products circuit according to embodiments described herein.

FIG. 3 illustrates an in-memory sum-of-products circuit including an expanded array of memory cells, such as NOR flash memory cells. The expanded array includes a plurality of blocks (e.g. 50, 51) of memory cells. In this example, the array includes 512 word lines WL0 to WL511, where each block of memory cells includes 32 rows. Thus, block 50 includes memory cells on word lines WL0 to WL31, and block 51 includes memory cells on word lines WL480 to WL511. Also, in this example, the array includes 512 bit lines BL0 to BL511.

Each block includes corresponding local bit lines that are coupled to the global bit lines BL0 to BL511 by corresponding block select transistors (e.g. 58, 59, 60, and 61) on block select lines BLT0 to BLT15.

A row decoder 55 (labeled XDEC) is coupled to the word lines, and is responsive to addressing or sequencing circuitry to select one or more word lines at a time in one or more blocks at a time as suits a particular operation. Also, the row decoder 55 includes word line drivers to apply word line voltages in support of the sum-of-products operation.

Each particular word line WLn is coupled to a row of memory cells in the array. The illustrated example, WLn is coupled to memory cells (e.g. 68, 69, 70, and 71). Each memory cell in the row corresponding to WLn is programmed with an analog or multibit value $W_{i,n}$, where the index i corresponds to the bit line or column in the array, and the index n corresponds to the word line or row in the array.

Each bit line is coupled to bit line bias circuits, including a corresponding bit line clamp transistor (75, 76, 77, and 78). The gate of each bit line clamp transistor is coupled to a corresponding digital-to-analog converter DAC (80, 81, 82, and 83). Each digital-to-analog converter has a digital input corresponding to the input variable $X_{1,n}$, where the index i corresponds with the bit line number and the index n corresponds with the selected word line number. Thus, the input value on the digital-to-analog converter DAC 80 on bit line BL0 receives a digital input $X_{0,n}$ during the sum-of-products computation for the row corresponding to word line WLn. In other embodiments, the input variables can be applied by varying the block select line voltages connected to the block select transistors (e.g. 58, 59, 60, and 61) on block select lines BLT0 to BLT15. In this embodiment, the block select transistors are part of the bit line bias circuits.

In the illustrated example, the array includes a set of bit lines BL0 to BL511 which is arranged in 128 subsets of four bit lines each. The four bit lines for each subset are coupled through the corresponding bit line clamp transistors to a summing node (e.g. 85, 86), which is in turn coupled to a corresponding current sensing sense amplifier SA0 (90) and SA127 (91). The outputs of the sense amplifiers on lines 92, 93 are digital values representing the sum of the terms represented by the cells on the corresponding four bit lines on word line WLn. These digital values can be provided to a digital summing circuit to produce an output representing a 512 term sum-of-products computation, based on in-memory computation of 128 four-term sum-of-products computations.

In other embodiments, the number of bit lines in each subset can be any number, up to and including all of the bit lines in the set of bit lines in the array. The number of bit lines in each subset can be limited based on the range of the sense amplifiers utilized. The range of the sense amplifiers is a trade-off between a variety of factors including the complexity of the circuitry required, and the speed of operation required for a given implementation.

As mentioned above, each memory cell is programmed with a weight value $W_{i,n}$. In an example in which the memory cell is a flash cell, the weight value can be represented by a threshold voltage that is programmed by charge tunneling into the charge trapping structure of the cell. Multilevel programming or analog programming algorithms can be utilized, in which the power applied for the purposes of programming a value in the memory cell is adjusted according to the desired threshold voltage.

Figure 4:
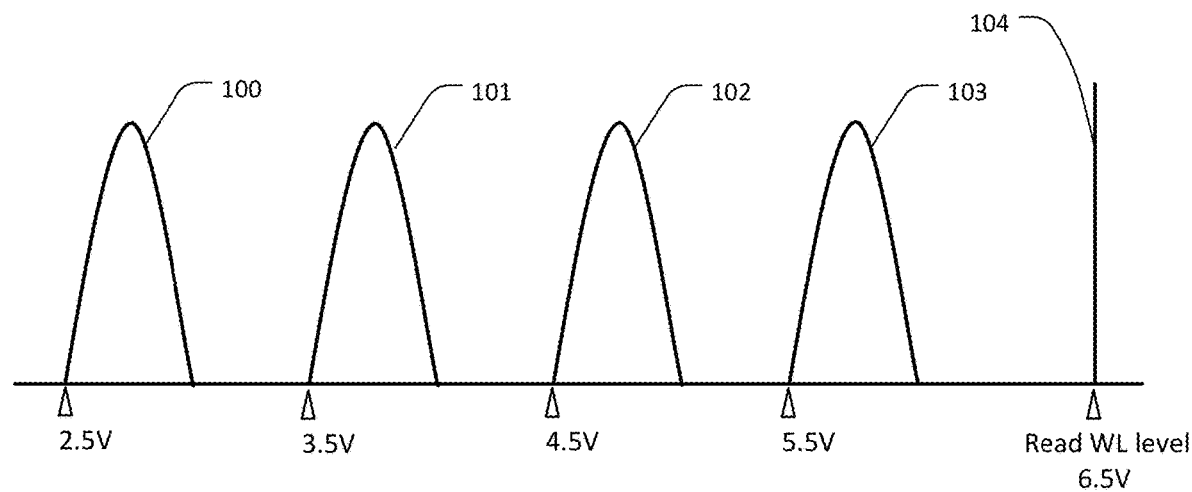
FIG. 4 is a graph showing distributions of threshold voltages which correspond to weights or coefficients stored in memory cells in embodiments described herein.

FIG. 4 illustrates a representative distribution of threshold voltages usable to store four different weight values in each cell. For example, the weight stored in a given cell can have a first value falling within the distribution 100 programmed to have a minimum threshold of 2.5 V, a second value falling within the distribution 101 programmed to have a minimum threshold of 3.5 V, a third value falling within distribution 102 programmed to have a minimum threshold of 4.5 V and a fourth value falling within distribution 103 program to have a minimum threshold of 5.5 V. In order to execute a sum-of-products operation for memory cells having weights within these ranges of thresholds, a word line voltage 104 of about 6.5 V can be applied. The current output of a memory cell receiving the word line voltage will be a function of the difference between the word line voltage and the threshold value stored in the cell, and the bit line bias voltage applied to the line by the bias voltage applied by the bit line circuits.

In some embodiments, the threshold voltages achieved during the programming operation can be implemented using an analog technique, which does not rely on minimum or maximum threshold levels for each programming operation, but rather relies on the power applied in one pulse or multiple pulses during the programming operation which might be determined based on analog or digital inputs.

Figure 5:
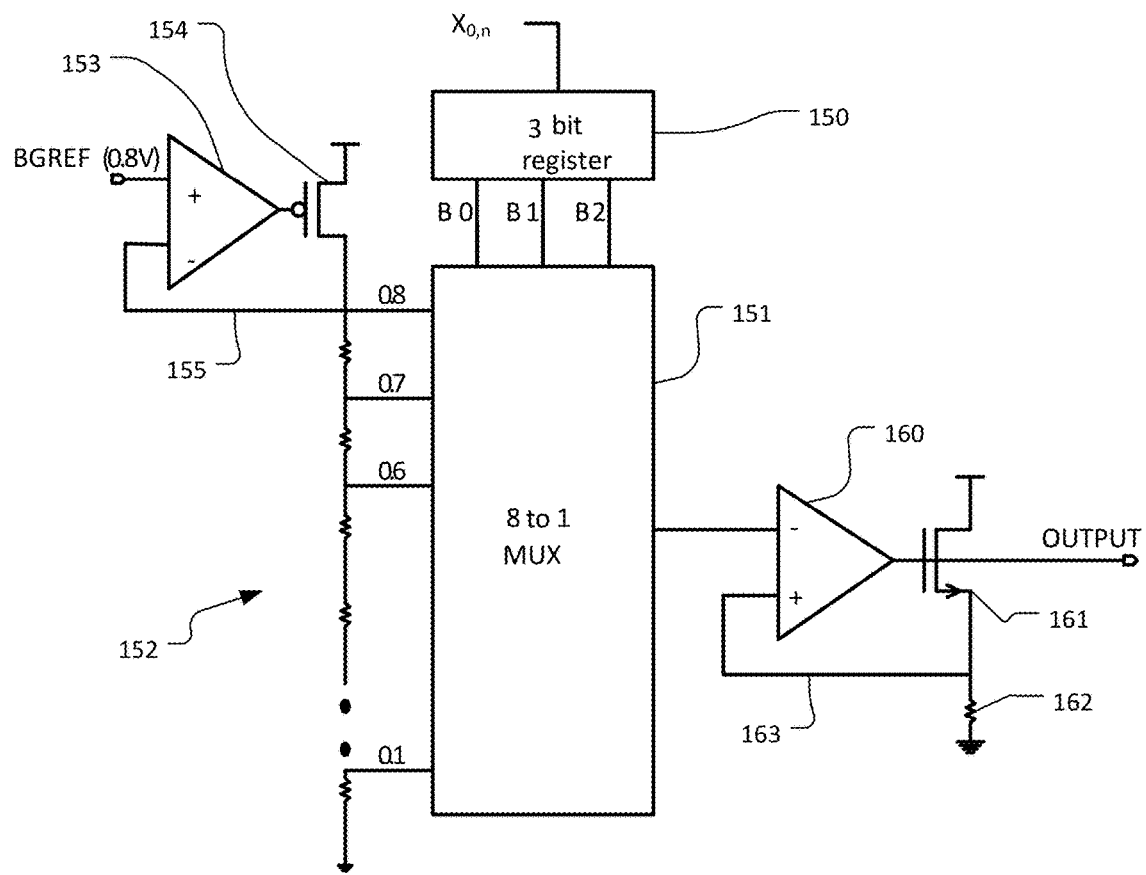
FIG. 5 is a diagram of an example digital-to-analog converter usable as a bit line bias circuit in embodiments described herein.

FIG. 5 illustrates an example of a digital-to-analog converter which accepts a three-bit input value $(X_{0,n})$ stored in a register 150. The output of the register 150 is coupled to a multiplexer 151, and selects one of the inputs to the multiplexer. For a three-bit input value, the multiplexer selects from among eight inputs. The inputs Q1 to Q8 in this example are generated by a resistor ladder 152. The resistor ladder 152 includes a current source implemented using an operational amplifier 153 having output driving the gate of a p-channel transistor 154. The source of the p-channel transistor 154 is coupled to the resistor ladder 152. The operational amplifier 153 has a first input coupled to a bandgap reference voltage BGREF which can be about 0.8 V for example, and a second input connected in feedback 155 to the source of the p-channel transistor 154. The output of the multiplexer 151 is coupled to an operational amplifier in a unity gain configuration, with an output connected to the gate of n-channel transistor 161, which has its source connected via resistor 162 to ground, and in feedback 163 to the second input of the operational amplifier 160.

The bit line circuits on each of the bit lines in an embodiment like that of FIG. 3 can have corresponding three-bit registers (e.g. 150) coupled to three-bit digital-to-analog converters. Of course converters of greater or lesser precision can be utilized as suits a particular implementation.

Figure 6:
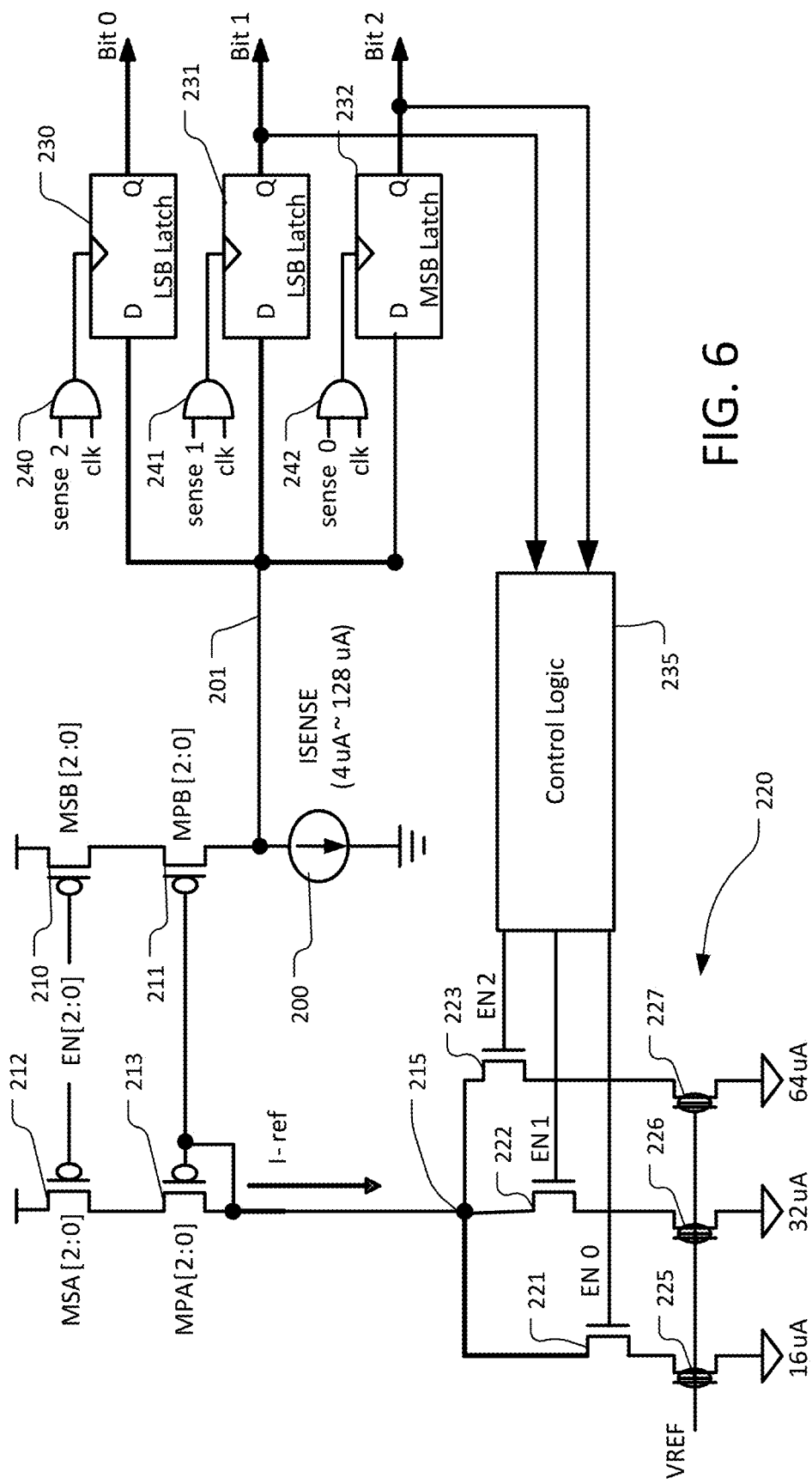
FIG. 6 is a diagram of an example sense amplifier suitable for sensing current sums according to embodiments described herein.

FIG. 6 illustrates an example of a sense amplifier in a circuit like that of FIG. 3. For example, a sense amplifier like that of FIG. 6 can be configured to sense currents over a range of about 4 μA to about 128 μA, and convert those values into a three-bit digital output Bit0, Bit1, Bit2.

In this diagram, the current ISENSE from an input summing node corresponding to the outputs from a subset of the bit lines in the array is represented by the current ISENSE 200. The current ISENSE 200 is coupled to a current sensing circuit having an input side including transistor set 210, 211, and a reference side including transistor set 212, 213.

The input side transistor set 210, 211 includes transistors MSB[2:0] 210 which have inputs connected to corresponding enable signals EN[2:0] which are asserted during a sensing sequence as described below. Also, the input side transistor set 210, 211 includes transistors MPB[2:0] 211 configured in series with corresponding transistors in the transistor set MSB[2:0] 210.

Reference side transistor set 212, 213 includes transistors MSA[2:0] 212 which have inputs connected to corresponding enable signals EN[2:0] which are asserted during a sensing sequence as described below. Also, the reference side transistor set 212, 213 includes current mirror reference transistors MPA[2:0] configured in series with corresponding transistors in the transistor set MSA[2:0]. The gates of the transistors MPA[2:0] are connected to the sources of the transistors, and in a current mirror configuration with the gates of the transistors MPB[2:0].

A reference current I-ref is applied to the reference side transistor set, and is generated using a reference current generator 220. The reference current generator 220 includes current source transistors 225, 226, 227 having their gates controlled by a reference voltage VREF. The current source transistors 225, 226, 227 are sized so as to produce respective currents 16 µA, 32 µA and 64 µA.

The outputs of the current source transistors 225, 226, 227 are connected to corresponding enable transistors 221, 222, 223, which are controlled respectively by control signals EN0, EN1 and EN2, which also control the transistors MSA[2:0] 212 and MSB[2:0] 210. The enable transistors 221, 222, 223 connect the current source transistors to the node 215, at which the current I-ref is provided.

The sense amplifier includes a sensing node 201, which fluctuates according to the difference between the current ISENSE 200 and the reference current I-ref, as adjusted by scaling of the current mirror transistors on the input side relative to the reference side. The sensing node 201 is connected to the D input of three latches 230, 231, 232. The latches 230, 231, 232 are clocked by the signals on the outputs of corresponding AND gates 240, 241, 242. The AND gates 240, 241, 242 receive as inputs the control signals sense2, sense1, sense0 respectively and a sensing clock signal clk. The outputs of the latches 230, 231, 232 provide the three bit output Bit0, Bit1, Bit2 of the sense amplifier. The outputs Bit1 and Bit2, where Bit2 is the most significant bit, are coupled to the control logic 235, which generates the control signals EN[2:0].

Figures 7, 8:
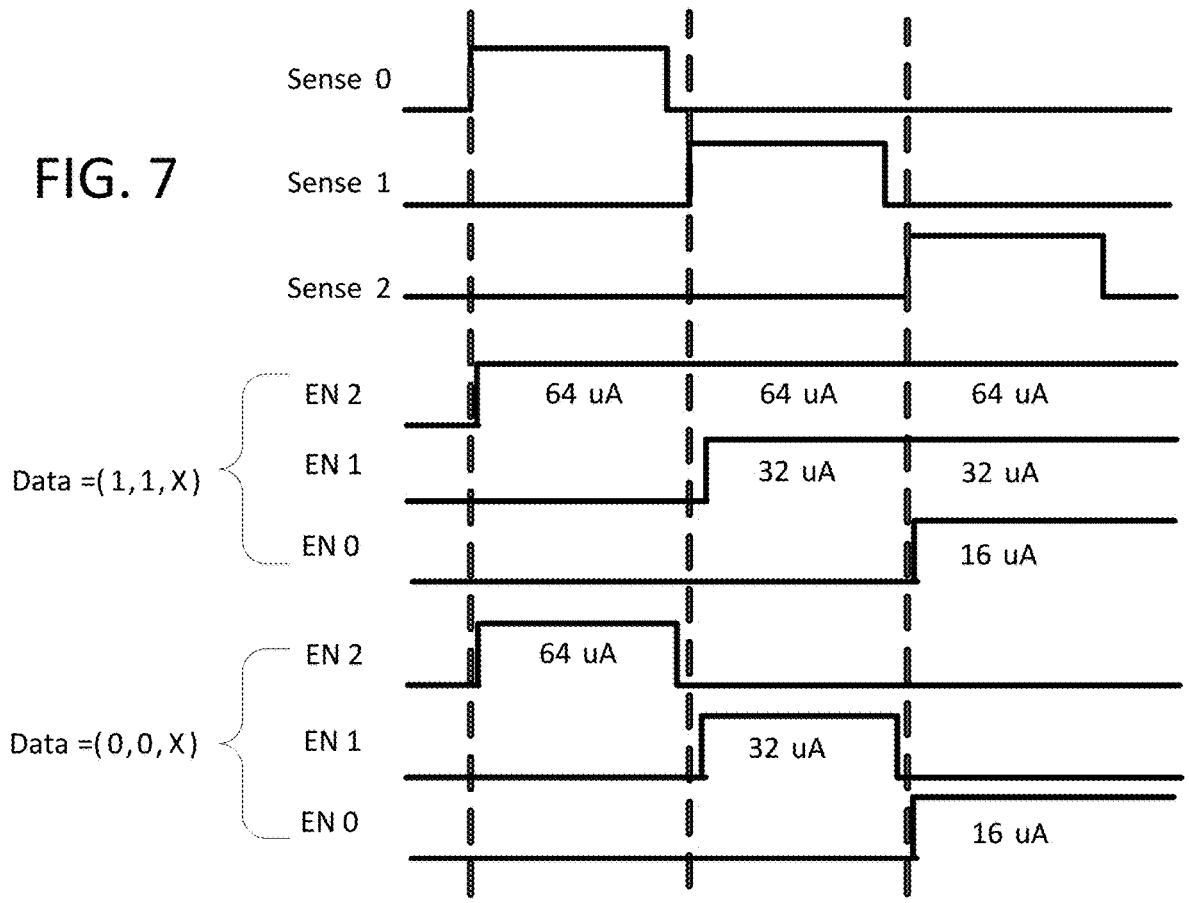
FIG. 7 is a timing diagram showing operation of the sense amplifier of FIG. 6.
FIG. 8 is a logic table showing operation of the sense amplifier of FIG. 6.

FIG. 7 illustrates a timing diagram for the circuit of FIG. 6. As can be seen, the control signals Sense0 to Sense2 are asserted in sequence. Upon assertion of the control signal Sense0, the enable signal EN2 is asserted. In this case, the reference current I-ref will be equal to the current through transistor 227 or 64 µA. The MSB latch 232 will store a bit indicating whether the current is above or below 64 µA.

Upon assertion of the control signal Sense1, both control signal EN2 and control signal EN1 are asserted if Bit2 is 1, corresponding to the value above 64 µA, and the control signal EN1 is not asserted if the Bit2 is zero. In the first case, this results in producing a current I-ref equal to the sum-of-currents from transistors 226 and 227, or 96 µA, in this example. In the second case, this results in producing a current I-ref equal to the current from transistor 226 alone, or 32 µA, in this example. The latch 231 will store a value Bit1 indicating whether the current is above or below 96 µA in the first case, or above or below 32 µA in the second case.

Upon assertion of the control signal Sense2, in the first case, all three control signals EN2, EN1 and EN0 are asserted in the case, illustrated resulting in a current I-ref equal to 112 µA, if both Bit2 and Bit1 are 1. If Bit1 is 0 (case Data=(1,0,x) not shown), then the control signal EN1 is not asserted resulting in a current I-ref equal to 80 µA.

Upon assertion of control signal Sense2 in the second case, only the control signal EN0 is asserted, resulting in a current I-ref equal to 16 µA if both Bit2 and Bit1 are zero. If Bit1 is 1 (case Data=(0,1,x) not shown), then both EN1 and EN0 are asserted, resulting in a current I-ref equal to 48 µA.

The table shown in FIG. 8 illustrates the logic, which can be executed by the control circuitry illustrated in FIG. 1 for example.

Figure 9:
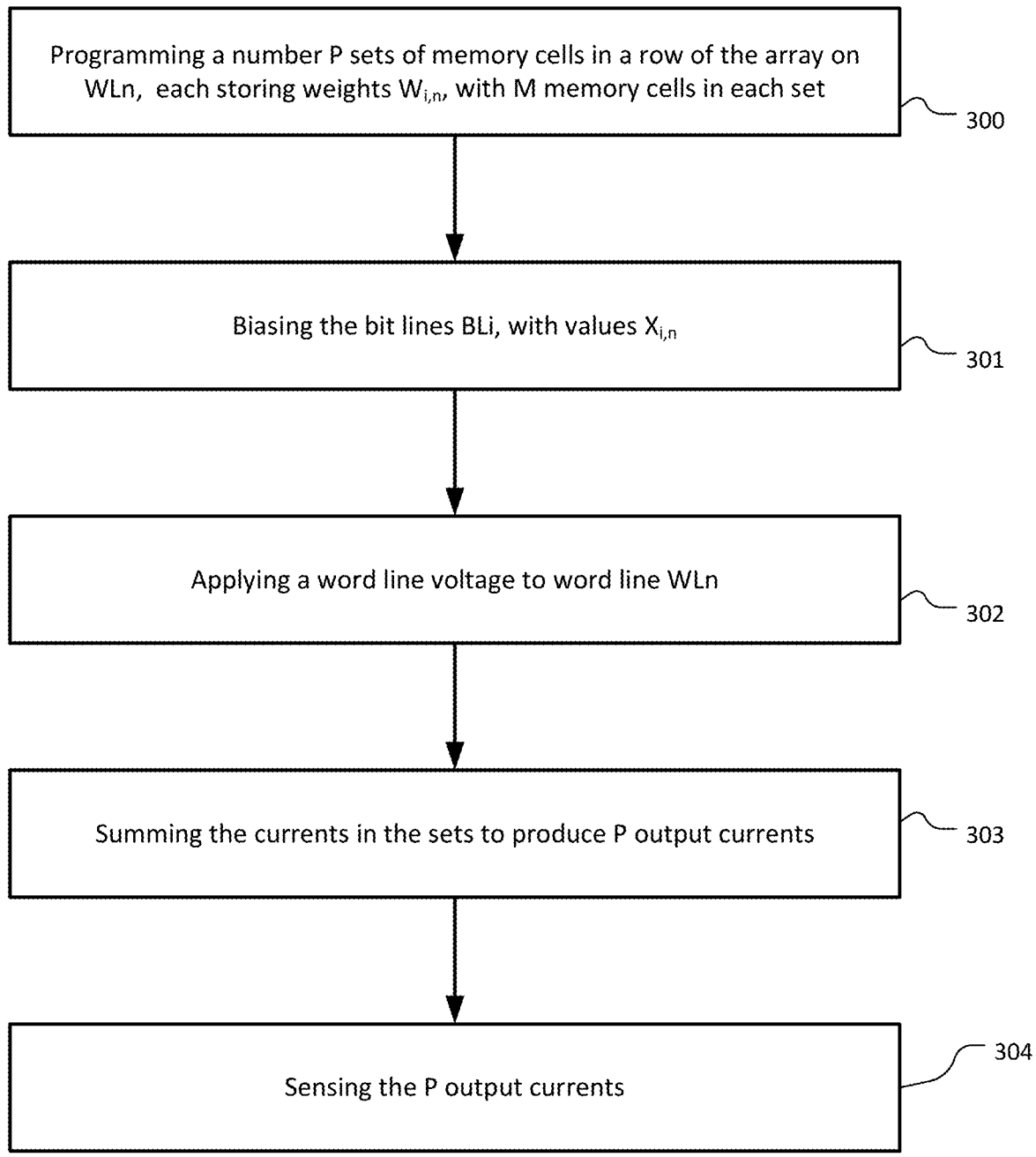
FIG. 9 is a flowchart of an in-memory sum-of-products operation according to embodiments described herein.

FIG. 9 is a flowchart showing a method for in-memory sum-of-product computation utilizing a memory array including a plurality of bit lines and a plurality of word lines, such as a NOR flash array.

The illustrated method includes for each row being utilized in a sum-of-products operation, programming a number P sets of memory cells in a row of the array, with M memory cells in each set, the P sets of memory cells on word line WLn and on bit lines BLi, for i going from 0 to P*M−1, with the values $W_{i,n}$, for i going from 0 to P*M−1 (300). Also, the method includes biasing the bit lines BLi, with values $X_{i,n}$, respectively, for i going from 0 to P*M−1 (301). To cause execution of a sum-of-products computation, the method includes applying a word line voltage to word line WLn so that the memory cells on the row conduct current corresponding to a product from respective cells in the row of $W_{i,n}*X_{i,n}$ (302). While applying the word line voltage, the method includes summing the currents on the M bit lines connected to each of the P sets of memory cells, to produce P output currents (303). An output of the sum-of-products operation is produced by sensing the P output currents (304).

The flowchart in FIG. 9 illustrates logic executed by a memory controller or by in-memory sum-of-products device. The logic can be implemented using processors programmed using computer programs stored in memory accessible to the computer systems and executable by the processors, by dedicated logic hardware, including field programmable integrated circuits, and by combinations of dedicated logic hardware and computer programs. It will be appreciated that many of the steps can be combined, performed in parallel, or performed in a different sequence, without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow chart shows only steps that are pertinent to an understanding of the technology presented, and it will be understood that numerous additional steps for accomplishing other functions can be performed before, after and between those shown.

Figure 10:
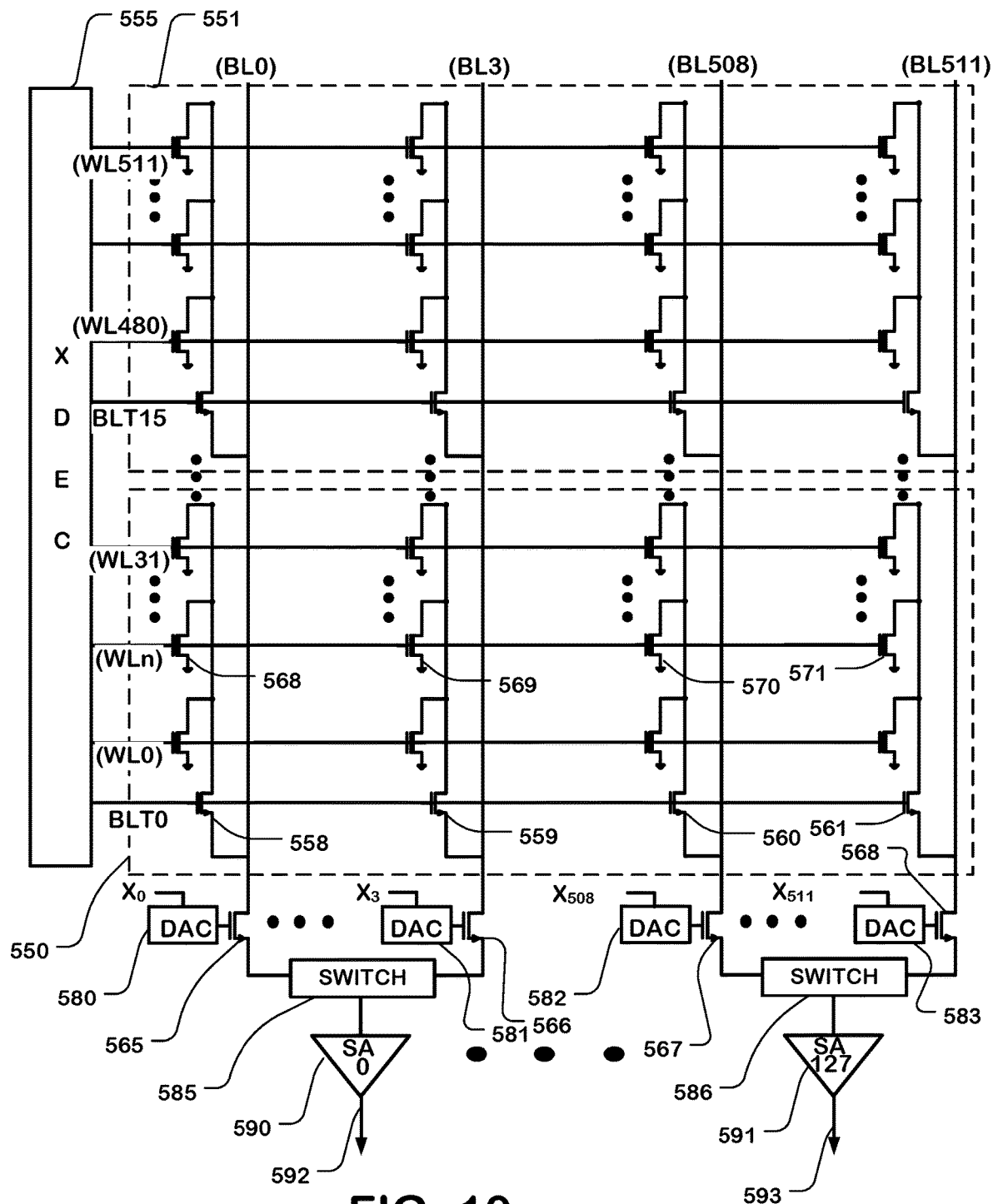
FIG. 10 is a more detailed diagram of an alternative sum-of-products circuit according to embodiments described herein.

FIG. 10 illustrates an in-memory sum-of-products circuit including an expanded array of memory cells, such as NOR flash memory cells, configurable for applying input values on a plurality of word lines, and weights on bit line bias circuits, operable to sum the current from a plurality of cells on one bit line at a time. The expanded array includes a plurality of blocks (e.g. 550, 551) of memory cells. In this example, the array includes 512 word lines WL0 to WL511, where each block of memory cells includes 32 rows. Thus, block 550 includes memory cells on word lines WL0 to WL31, and block 551 includes memory cells on word lines WL480 to WL511. Also, in this example, the array includes 512 bit lines BL0 to BL511.

Each block includes corresponding local bit lines that are coupled to the global bit lines BL0 to BL511 by corresponding block select transistors (e.g. 558, 559, 560, and 561) on block select lines BLT0 to BLT15.

A row decoder 555 (labeled XDEC) is coupled to the word lines, and is responsive to addressing or sequencing circuitry to select a plurality of word lines at a time in one or more blocks at a time as suits a particular operation. Also, the row decoder 555 includes word line drivers to apply word line voltages in support of the sum-of-products operation.

Each particular word line WLn is coupled to a row of memory cells in the array. The illustrated example, WLn is coupled to memory cells (e.g. 568, 569, 570, and 571). Each memory cell in the row corresponding to WLn is programmed with an analog or multibit value $W_{i,n}$, where the index i corresponds to the bit line or column in the array, and the index n corresponds to the word line or row in the array.

Each bit line is coupled to bit line bias circuits, including a corresponding bit line clamp transistor (565,566, 567, and 568). The gate of each bit line clamp transistor is coupled to a corresponding digital-to-analog converter DAC (580, 581, 582, and 583). Each digital-to-analog converter has a digital input corresponding to the input variable $X_{i,n}$, where the index i corresponds with the bit line number and the index n corresponds with the selected word line number. Thus, the input value on the digital-to-analog converter DAC 580 on bit line BL0 receives a digital input $X_{0,n}$ during the sum-of-products computation for the row corresponding to word line WLn. In other embodiments, the input variables can be applied by varying the block select line voltages connected to the block select transistors (e.g. 558, 559, 560, and 561) on block select lines BLT0 to BLT15. In this embodiment, the block select transistors are part of the bit line bias circuits.

In the illustrated example, the array includes a set of bit lines BL0 to BL511 which is arranged in 128 subsets of four bit lines each. The four bit lines for each subset are coupled through the corresponding bit line clamp transistors to a switch (e.g. 585, 586), operable to select one bit line from the corresponding subset, and connect the selected bit line to a corresponding current sensing sense amplifier SA0 (590) and SA127 (591). The outputs of the sense amplifiers on lines 592, 593 are digital values representing the sum of the terms represented current in a plurality of cells on one selected bit line. These digital values can be provided to a digital summing circuit to produce an output representing a sum-of-products computation, based on in-memory computation of 128 sum-of-products computations. The switches can be operated to switch in sequence from bit line to bit line, to produce a sequence of digital outputs representing the sum of current on corresponding bit lines. In other embodiments, a sense amplifier can be connected to each bit line, and the switches 585, 586 may be eliminated.

In other embodiments, the number of bit lines in each subset can be any number, up to and including all of the bit lines in the set of bit lines in the array. The number of bit lines in each subset can be limited based on the range of the sense amplifiers utilized. The range of the sense amplifiers is a trade-off between a variety of factors including the complexity of the circuitry required, and the speed of operation required for a given implementation.

As mentioned above, each memory cell is programmed with a weight value $W_{i,n}$. In an example in which the memory cell is a flash cell, the weight value can be represented by a threshold voltage that is programmed by charge tunneling into the charge trapping structure of the cell. Multilevel programming or analog programming algorithms can be utilized, in which the power applied for the purposes of programming a value in the memory cell is adjusted according to the desired threshold voltage.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for performing an in-memory multiply-and-accumulate function, using an array of memory cells, comprising:

applying a word line voltage to word line WLn to access M memory cells in a row of the array on bit lines BLi, for i going from 0 to M-1, the M memory cells storing values $W_{i,n}$, for i going from 0 to M-1;

biasing bit lines BLi, with input values $X_{i,n}$, respectively, for i going from 0 to M-1, so that individual ones of the M memory cells on word line WLn conduct current indicative of product of $W_{i,n}$ and $X_{i,n}$, for i going from 0 to M-1, wherein biasing the bit lines BLi includes (i) converting, using corresponding digital-to-analog converters, digital inputs Xi,n to analog bias voltages and (ii) applying the analog bias voltages to corresponding bit line clamp transistors to generate corresponding bit line voltages as a function of the digital inputs Xi,n for the respective bit lines BLi;

summing the currents from a plurality of memory cells to produce an output current; and sensing the output current.

2. The method of claim 1, wherein summing the currents from the plurality of memory cells includes summing the currents on the bit lines BLi, for i going from 0 to M-1.

3. The method of claim 1, wherein summing the currents from the plurality of memory cells includes applying word line voltage to a plurality of word lines in parallel so that the current on one of the bit lines BLi is the output current including currents from the plurality of memory cells.

4. The method of claim 1, wherein the memory cells comprise multilevel non-volatile memory cells.

5. The method of claim 1, including:

applying a word line voltage to word line WLn to access a number P sets of memory cells in a row of the array, with M memory cells in each set, the P sets of memory cells on word line WLn and on bit lines BLi, for i going from 0 to P*M−1, storing values $W_{i,n}$, for i going from 0 to P*M−1, one of said P sets including said first mentioned M memory cells;

biasing the bit lines BLi, with values $X_{i,n}$, respectively, for i going from 0 to P*M−1, so that the memory cells on the row of the array conduct current corresponding to a product from respective memory cells in the row of $W_{i,n}*X_{i,n}$;

summing the currents on the M bit lines connected to each of the P sets of memory cells, to produce P output currents; and sensing the P output currents.

6. The method of claim 1, including programming the memory cells on the row with the weights $W_{i,n}$.

7. The method of claim 1, including adjusting the biasing on the bit lines BLi, for i going from 0 to M-1, in response to variations in voltage on a source line coupled to at least part of the array of memory cells.

8. An in-memory multiply-and-accumulate circuit, comprising:

a memory array including memory cells on a set of word lines and a set of bit lines;

a row decoder coupled to the set of word lines, configured to apply word line voltages to one or more selected word lines in the set;

a plurality of bit line bias circuits, individual ones of the bit line bias circuits in the plurality of bit line bias circuits having corresponding inputs connected to an input data path, and having outputs connected to respective bit lines in the set of bit lines, and producing bit line bias voltages for the respective bit lines as a function of input values on the corresponding inputs;

a plurality of current sensing circuits, each of the plurality of current sensing circuits being connected to receive currents from one or more bit lines in the set of bit lines, and to produce an output in response to a sum-of-the-currents from a corresponding plurality of memory cells; and circuits to program a first memory cell in the array with a weight W, wherein a first bit line bias circuit of the plurality of bit line bias circuits includes (i) a digital-to-analog converter to convert a multiple-bit digital input X to an analog bias voltage, and (ii) a transistor to receive the analog bias voltage at a gate of the transistor and to generate a bit line voltage that is output to a first bit line corresponding to the first memory cell, and wherein the first memory cell is to conduct a current indicative of a product of the weight W and the input X.

9. The circuit of claim 8, wherein multi-member subsets of the set of bit lines are connected to a current summing node, and current sensing circuits in the plurality of current sensing circuits are connected to respective summing nodes.

10. The circuit of claim 8, wherein current sensing circuits in the plurality of current sensing circuits are configured to sense current from one of the bit lines in the set of bit lines, while the row decoder applies word line voltages to a plurality of word lines in parallel so that the current on one of the bit lines includes currents from the plurality of memory cells.

11. The circuit of claim 8, wherein the individual ones of the bit line bias circuits in the plurality of bit line bias circuits comprise digital-to-analog converters.

12. The circuit of claim 8, including circuits to program the memory cells in the array with weights $W_{i,n}$, in memory cells in a row of the array on word line WLn in the set of word lines and on bit lines BLi in the set of bit lines to store values.

13. The circuit of claim 8, wherein the memory cells comprise multilevel non-volatile memory cells.

14. The circuit of claim 8, wherein the plurality of bit line bias circuits include digital-to-analog converters to convert multiple-bit digital inputs $X_{i,n}$ to analog bias voltages, and to apply the analog bias voltages to the respective bit lines BLi.

15. The circuit of claim 8, wherein the memory array has a NOR architecture.

16. The circuit of claim 15, wherein the memory array comprises dielectric charge trapping memory cells.

17. The circuit of claim 8, wherein the plurality of bit lines are configured in P sets of bit lines having M members each, where M is greater than one, and the plurality of sensing circuits are connected to corresponding sets in the P sets of bit lines.

18. The circuit of claim 8, wherein the memory array of memory cells comprises charge trapping memory cells in a NOR architecture having a source line coupled to at least some of the memory cells in the array, and including a source line bias circuit coupled to the plurality of bit line bias circuits, to provide feedback in response to variations in voltage on the source line.

19. The circuit of claim 15, wherein the memory array comprises floating gate memory cells.

20. An in-memory multiply-and-accumulate circuit, comprising:

a memory array including a first memory cell on a first word line and a first bit line;

a row decoder coupled to a set of word lines that includes the first word line, configured to apply word line voltages to one or more selected word lines in the set;

a first bit line bias circuit comprising (i) a digital-to-analog converter to receive a corresponding first input X and to generate an analog signal, and (ii) a bit line clamp transistor to receive the analog signal at a gate of the bit line clamp transistor, and to generate an output connected to the first bit line, the first bit line bias circuit to produce a first bit line bias voltage for the first bit line as a function of the first input X; and circuits to program the first memory cell with a weight W, wherein the first memory cell is to conduct a current indicative of a product of the weight W and the input X.

* * * * *